United States Patent
Namai et al.

(10) Patent No.: US 12,456,956 B2
(45) Date of Patent: Oct. 28, 2025

(54) CHOPPER STABILIZED AMPLIFIER

(71) Applicants: Kabushiki Kaisha Toshiba, Tokyo (JP); Toshiba Electronic Devices & Storage Corporation, Tokyo (JP)

(72) Inventors: Atsushi Namai, Kawasaki Kanagawa (JP); Hironori Nagasawa, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 499 days.

(21) Appl. No.: 17/890,856

(22) Filed: Aug. 18, 2022

(65) Prior Publication Data
US 2023/0238928 A1   Jul. 27, 2023

(30) Foreign Application Priority Data
Jan. 25, 2022   (JP) .................. 2022-009632

(51) Int. Cl.
*H03F 3/393*   (2006.01)

(52) U.S. Cl.
CPC .................... *H03F 3/393* (2013.01)

(58) Field of Classification Search
CPC ............. H03F 3/393; H03F 2200/171; H03F 2200/411; H03F 2203/45512; H03F 2203/45652; H03F 3/387; H03F 3/45475; H03F 1/30; H03F 3/345; H03F 3/45179
USPC .......................................... 330/10
See application file for complete search history.

(56) References Cited

U.S. PATENT DOCUMENTS

| | | |
|---|---|---|
| 6,262,626 B1 | 7/2001 | Bakker et al. |
| 7,508,258 B2 | 3/2009 | Yoshizawa et al. |
| 8,258,863 B2 | 9/2012 | Gupta et al. |
| 9,071,208 B2 | 6/2015 | Nagahisa |

(Continued)

FOREIGN PATENT DOCUMENTS

| | | |
|---|---|---|
| JP | 2002-530916 A | 9/2002 |
| JP | 2007-214613 A | 8/2007 |

(Continued)

OTHER PUBLICATIONS

First Office Action issued in Japanese Patent Application No. 2022-009632 dated Mar. 3, 2025 in 8 pages.

(Continued)

*Primary Examiner* — Andrea Lindgren Baltzell
*Assistant Examiner* — Jose E Pinero
(74) *Attorney, Agent, or Firm* — Knobbe, Martens, Olson & Bear, LLP

(57) ABSTRACT

According to one embodiment, a chopper stabilized amplifier includes an input unit, a first chopper, a first amplifier, and a switch circuit. The input unit receives a differential input signal at a first input terminal and a second input terminal. The first chopper modulates the differential input signal based on a first control signal and an inverse signal of the first control signal. The first amplifier amplifies the signals with the modulated differential output from the first chopper. The switch circuit is provided between the input unit and the first chopper, and receives a second control signal and reduces input currents which flow in the first chopper when the first chopper performs a modulating operation, by using an operation with the second control signal.

12 Claims, 13 Drawing Sheets

(56) References Cited

U.S. PATENT DOCUMENTS

| | | | |
|---|---|---|---|
| 10,060,951 | B2 | 8/2018 | Ota |
| 2018/0076779 | A1 | 3/2018 | Wang et al. |
| 2019/0158035 | A1* | 5/2019 | Trifonov ................. H03F 3/387 |
| 2023/0336135 | A1* | 10/2023 | Hasebe ................... H03F 3/387 |

FOREIGN PATENT DOCUMENTS

| | | |
|---|---|---|
| JP | 2010-141406 A | 6/2010 |
| JP | 2014-502127 A | 1/2014 |
| JP | 2014-060530 A | 4/2014 |
| JP | 2016-127422 A | 7/2016 |
| JP | 5961629 B2 | 8/2016 |
| JP | 2017-098731 A | 6/2017 |
| JP | 2018-061143 A | 4/2018 |
| WO | WO 2022/049888 A1 | 3/2022 |

OTHER PUBLICATIONS

Office Action issued in Japanese Patent Application No. 2022-009632 dated May 19, 2025 in 6 pages.

\* cited by examiner

Fig. 4A (Scc1"enable"、Scc2"disable")
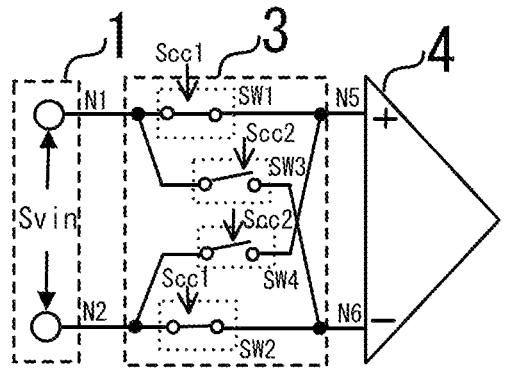
Fig. 4B (Scc1"disable"、Scc2"enable")
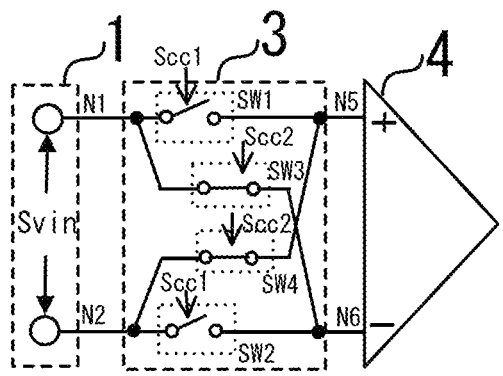
Fig. 4C (Scc1、Scc2"transition region")
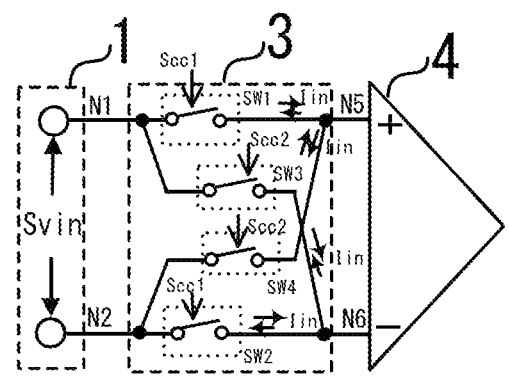

CHOPPER STABILIZED AMPLIFIER

This application is based upon and claims the benefit of priority from the prior Japanese Patent Application No. 2022-9632, filed on Jan. 25, 2022, the entire contents of which are incorporated herein by reference.

FIELD

The embodiments to be described herein are directed to a chopper stabilized amplifier.

BACKGROUND

Amplifiers are mounted in various devices for consumer use and industrial use. For amplifiers, it is very important to reduce noise and offset voltage. A number of chopper amplifiers have been developed as high-accuracy amplifiers with reduced noise and offset.

Chopper amplifiers have a problem that input currents are generated when a chopper performs a modulating operation. An increase in the input currents leads to a voltage drop, which lowers the voltage accuracy. Hence, there has been a demand for chopper stabilized amplifiers with significantly reduced input currents.

BRIEF DESCRIPTION OF THE DRAWINGS

FIG. 4A is a diagram describing operation of a chopper in the comparative example when a control signal Scc1 is in an enabled state and a control signal Scc2 is in a disabled state, FIG. 4B is a diagram describing operation of the chopper in the comparative example when the control signal Scc1 is a disabled state and the control signal Scc2 is in an enabled state, and FIG. 4C is a diagram describing operation of the chopper in the comparative example when the control signals Scc1, Scc2 are in "transition regions";

DETAILED DESCRIPTION

According to one embodiment, a chopper stabilized amplifier includes an input unit, a first chopper, a first amplifier, and a switch circuit. The input unit receives a differential input signal at a first input terminal and a second input terminal. The first chopper modulates the differential input signal based on a first control signal and an inverse signal of the first control signal. The first amplifier amplifies the signals with the modulated differential output from the first chopper. The switch circuit is provided between the input unit and the first chopper, and receives a second control signal and reduces input currents which flow in the first chopper when the first chopper performs a modulating operation, by using an operation with the second control signal.

A plurality of further embodiments will be described below with reference to the drawings. Throughout the drawings, identical reference signs designate identical or similar portions.

Figure 1:
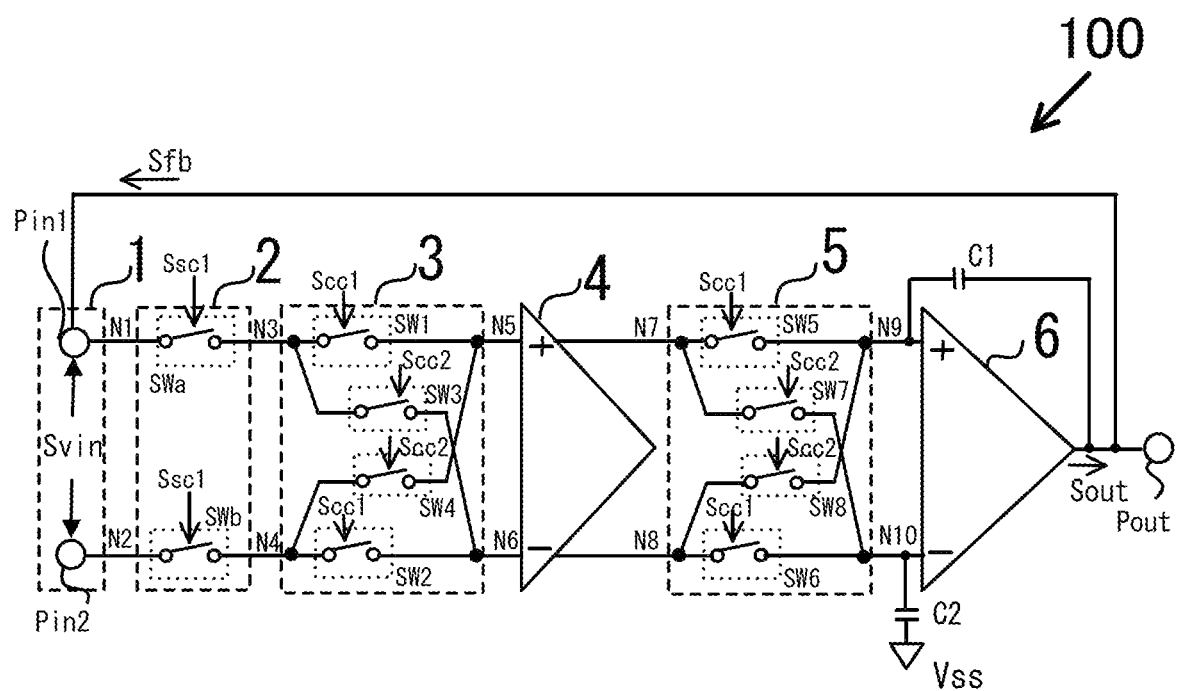
FIG. 1 is a circuit diagram showing a chopper stabilized amplifier according to a first embodiment.

A chopper stabilized amplifier according to a first embodiment will be described with reference to drawings. FIG. 1 is a circuit diagram showing the chopper stabilized amplifier.

In the first embodiment, a switch circuit to reduce input currents generated when an input chopper performs a modulating operation is provided between an input unit including a first input terminal and a second input terminal to input a differential input signal and the input chopper. The switch circuit includes a first switch configured to connect between the first input terminal and the input chopper based on a control signal, and a second switch configured to connect between the second input terminal and the input chopper based on the control signal.

As shown in FIG. 1, a chopper stabilized amplifier 100 includes an input unit 1, a switch circuit 2, a chopper 3, a chopper 5, an amplifier 4, an amplifier 6, a capacitor C1, a capacitor C2, and an output terminal Pout. The chopper stabilized amplifier 100 is used in a battery-driven device, a portable device, a medical device, a wearable device, Internet-of-Things (IoT), a medical sensor, a fitness tracker, or the like.

The chopper stabilized amplifier 100 modulates and amplifies a differential input signal, and then demodulates the amplified signals, thereby cancel out an offset voltage. The switch circuit 2 reduces input currents generated when the chopper 3 (first chopper) serving as an input chopper performs a modulating operation, based on an operation with the control signal (details will be described later).

The input unit 1 includes an input terminal Pin1 (first input terminal) and an input terminal Pin2 (second input terminal) to input the differential input signal Svin, which is a DC signal.

The switch circuit 2 is provided between the input unit 1 and the chopper 3 (first chopper) serving as an input chopper. The switch circuit 2 includes a switch SWa (first switch) and a switch SWb (second switch).

The switch SWa (first switch) is provided between a node N1 and a node N3 and operates based on a control signal Ssc1 (second control signal). The switch SWa (first switch) connects the input terminal Pin1 (first input terminal) and the node N3 (chopper 3 (first chopper)) when the control signal Ssc1 (second control signal) is in an enabled state, and disconnects the input terminal Pin1 (first input terminal) and the node N3 (chopper 3 (first chopper)) when the control signal Ssc1 (second control signal) is in a disabled state.

The switch SWb (second switch) is provided between a node N2 and a node N4 and operates based on the control signal Ssc1 (second control signal). The switch SWb (second switch) connects the input terminal Pin2 (second input terminal) and the node N4 (chopper 3 (first chopper)) when the control signal Ssc1 (second control signal) is in the enabled state, and disconnects the input terminal Pin2 (second input terminal) and the node N4 (chopper 3 (first chopper)) when the control signal Ssc1 (second control signal) is in the disabled state.

The chopper 3 (first chopper) serving as an input chopper is provided between the switch circuit 2 and the amplifier 4 (first amplifier), and includes a switch SW1 (third switch), a switch SW2 (fourth switch), a switch SW3 (fifth switch), and a switch SW4 (sixth switch).

The switch SW1 (third switch) is provided between the node N3 and a node N5 and operates based on a control signal Scc1 (first control signal). The switch SW1 (third switch) connects the node N3 and the node N5 (the plus input port of the amplifier 4) when the control signal Scc1 (first control signal) is in an enabled state, and disconnects the node N3 and the node N5 (the plus input port of the amplifier 4) when the control signal Scc1 (first control signal) is in a disabled state.

The switch SW2 (fourth switch) is provided between the node N4 and a node N6 and operates based on the control signal Scc1 (first control signal). The switch SW2 (fourth switch) connects the node N4 and the node N6 (the minus input port of the amplifier 4) when the control signal Scc1 (first control signal) is in the enabled state, and disconnects the node N4 and the node N6 (the minus input port of the amplifier 4) when the control signal Scc1 (first control signal) is in the disabled state.

The switch SW3 (fifth switch) is provided between the node N3 and the node N6 and operates based on a control signal Scc2 being an inverse signal of the control signal Scc1 (an inverse signal of the first control signal). The switch SW3 (fifth switch) connects the node N3 and the node N6 (the minus input port of the amplifier 4) when the control signal Scc2 being an inverse signal of the control signal Scc1 (an inverse signal of the first control signal) is in an enabled state, and disconnects the node N3 and the node N6 (the minus input port of the amplifier 4) when the control signal Scc2 being an inverse signal of the control signal Scc1 (an inverse signal of the first control signal) is in a disabled state.

The switch SW4 (sixth switch) is provided between the node N4 and the node N5 and operates based on the control signal Scc2 being an inverse signal of the control signal Scc1 (an inverse signal of the first control signal). The switch SW4 (sixth switch) connects the node N4 and the node N5 (the plus input port of the amplifier 4) when the control signal Scc2 being an inverse signal of the control signal Scc1 (an inverse signal of the first control signal) is in the enabled state, and disconnects the node N4 and the node N5 (the plus input port of the amplifier 4) when the control signal Scc2 being an inverse signal of the control signal Scc1 (an inverse signal of the first control signal) is in the disabled state.

Here, the control signal Scc1 and the control signal Scc2 being an inverse signal of the control signal Scc1 are clock signals controlled by a clock generator (not shown) or the like such that the enabled state accounts for 50% and the disabled state accounts for 50% for one clock period, i.e., a duty cycle of 50%-50%, for example. The control signal Ssc1 (second control signal) is a signal that requires a longer transition time (a time taken to transition from the enabled state to the disabled state or a time taken to transition from the disabled state to the enabled state) than the control signal Scc1 and the control signal Scc2 being an inverse signal (a complementary signal) of the control signal Scc1. The control signal Ssc1 (second control signal) is generated by combinational logic circuits or the like (not shown), for example.

The amplifier 4 (first amplifier) is provided between the chopper 3 (first chopper) serving as an input chopper and the chopper 5 (second chopper) serving as an output chopper, and amplifies signals with a modulated differential output from the chopper 3 (first chopper). The positive and negative output voltage signals thus amplified are input into the chopper 5 (second chopper).

The chopper 5 (second chopper) serving as an output chopper is provided between the amplifier 4 (first amplifier) and the amplifier 6 (second amplifier), and includes a switch SW5 (seventh switch), switch SW6 (eighth switch), switch SW7 (ninth switch), and switch SW8 (tenth switch).

The switch SW5 (seventh switch) is provided between a node N7 and a node N9 and operates based on the control signal Scc1 (first control signal). The switch SW5 (seventh switch) connects the node N7 and the node N9 (the plus input port of the amplifier 6) when the control signal Scc1 (first control signal) is in the enabled state, and disconnects the node N7 and the node N9 (the plus input port of the amplifier 6) when the control signal Scc1 (first control signal) is in the disabled state.

The switch SW6 (eighth switch) is provided between a node N8 and a node N10 and operates based on the control signal Scc1 (first control signal). The switch SW6 (eighth switch) connects the node N8 and the node N10 (the minus input port of the amplifier 6) when the control signal Scc1 (first control signal) is in the enabled state, and disconnects the node N8 and the node N10 (the minus input port of the amplifier 6) when the control signal Scc1 (first control signal) is in the disabled state.

The switch SW7 (ninth switch) is provided between the node N7 and the node N10 and operates based on the control signal Scc2 being an inverse signal of the control signal Scc1 (an inverse signal of the first control signal). The switch SW7 (ninth switch) connects the node N7 and the node N10 (the minus input port of the amplifier 6) when the control signal Scc2 being an inverse signal of the control signal Scc1 (an inverse signal of the first control signal) is in the enabled state, and disconnects the node N7 and the node N10 (the minus input port of the amplifier 6) when the control signal Scc2 being an inverse signal of the control signal Scc1 (an inverse signal of the first control signal) is in the disabled state.

The switch SW8 (tenth switch) is provided between the node N8 and the node N9 and operates based on the control signal Scc2 being an inverse signal of the control signal Scc1 (an inverse signal of the first control signal). The switch SW8 (tenth switch) connects the node N8 and the node N9 (the plus input port of the amplifier 6) when the control signal Scc2 being an inverse signal of the control signal Scc1 (an inverse signal of the first control signal) is in the enabled state, and disconnects the node N8 the node N9 (the plus input port of the amplifier 6) when the control signal Scc2 being an inverse signal of the control signal Scc1 (an inverse signal of the first control signal) is in the disabled state.

The amplifier 6 (second amplifier) is provided between the chopper 5 (second chopper) serving as an output chopper and the output terminal Pout, and amplifies modulated signals output from the chopper 5 (second chopper). An amplified output signal Sout is output through the output terminal Pout. The output signal Sout is fed back and input into the input terminal Pin1 (first input terminal) as a feedback signal Sfb. The capacitor C1 is a phase compensation capacitor provided between the node N9 and the output terminal Pout. The capacitor C2 is a phase compensation capacitor provided between the node N10 and a ground potential Vss.

Figure 2A:
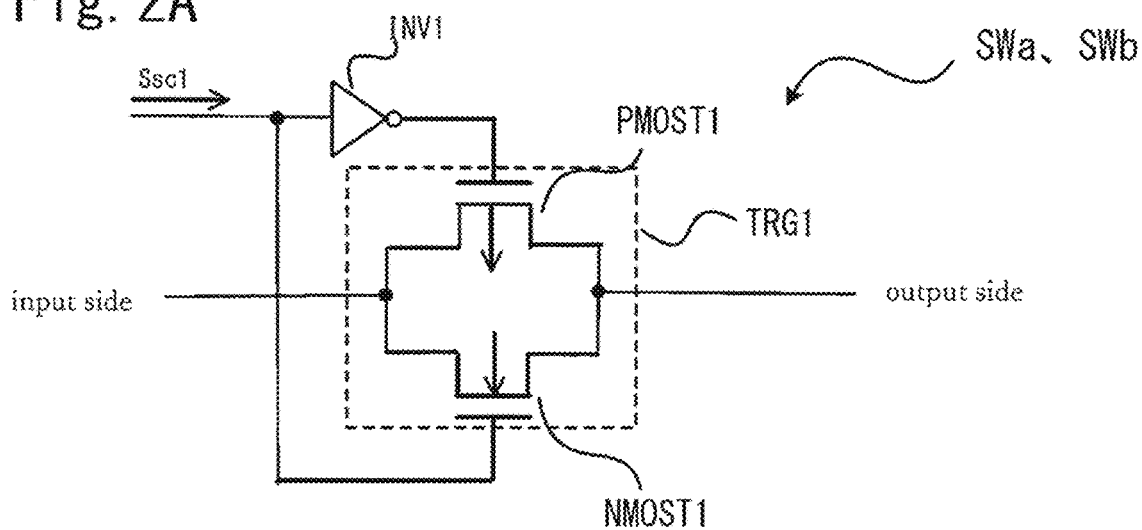
FIG. 2A is a circuit diagram of switches SWa and SWb according to the first embodiment.

As shown in FIG. 2A, the switch SWa (first switch) and the switch SWb (second switch) each includes an inverter INV1 and a transfer gate TRG1. The transfer gate TRG1 includes a P-channel MOS transistor PMOST1 and an N-channel MOS transistor NMOST1. The inverter INV1 receives the control signal Ssc1 (second control signal) and inverts the control signal Ssc1 (second control signal). A first terminal (source) and a second terminal (drain) of the P-channel MOS transistor PMOST1 are connected to an input side and an output side, respectively. A signal output from the inverter INV1 is input into a control terminal (gate) of the P-channel MOS transistor PMOST1. A first terminal (drain) and a second terminal (source) of the N-channel MOS transistor NMOST1 are connected to the input side and the output side, respectively. The control signal Ssc1 (second control signal) is input into a control terminal (gate) of the N-channel MOS transistor NMOST1. The transfer gate TRG1 connects the input side and the output side when the control signal Ssc1 (second control signal) is at a high level and the signal output from the inverter INV1 is at a low level, and disconnects the input side and the output side when the control signal Ssc1 (second control signal) is at a low level and the signal output from the inverter INV1 is at a high level. The switches SWa, SWb and SW1-SW8 each may be composed of MOS transistors with multistage structure.

Figure 2B:
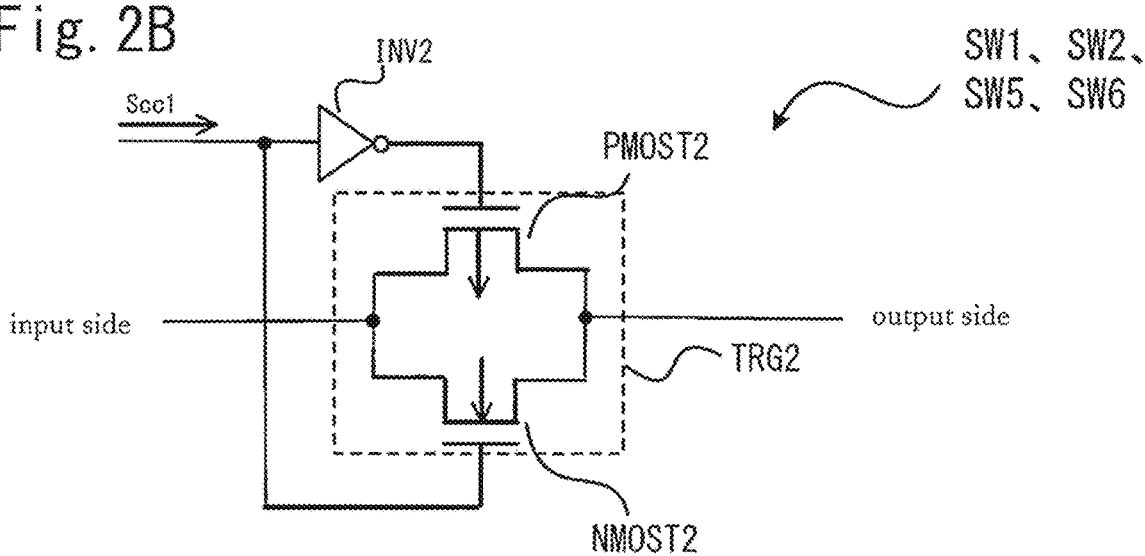
FIG. 2B is a circuit diagram of switches SW1, SW2, SW5 and SW6 according to the first embodiment.

As shown in FIG. 2B, the switch SW1 (third switch), the switch SW2 (fourth switch), the switch SW5 (seventh switch), and the switch 6 (eighth switch) each include an inverter INV2 and a transfer gate TRG2. The transfer gate TRG2 includes a P-channel MOS transistor PMOST2 and an N-channel MOS transistor NMOST2. The inverter INV2 receives the control signal Scc1 (first control signal) and inverts the control signal Scc1 (first control signal). A first terminal (source) and a second terminal (drain) of the P-channel MOS transistor PMOST2 are connected to an input side and an output side, respectively. A signal output from the inverter INV2 is input into a control terminal (gate) of the P-channel MOS transistor PMOST1. A first terminal (drain) and a second terminal (source) of the N-channel MOS transistor NMOST2 are connected to the input side and the output side, respectively. The control signal Scc1 (first control signal) is input into a control terminal (gate) of the N-channel MOS transistor NMOST2. The transfer gate TRG2 connects the input side and the output side when the control signal Scc1 (first control signal) is at a high level and the signal output from the inverter INV2 is at a low level, and disconnects the input side and the output side when the control signal Scc1 (first control signal) is at a low level and the signal output from the inverter INV2 is at a high level.

Figure 2C:
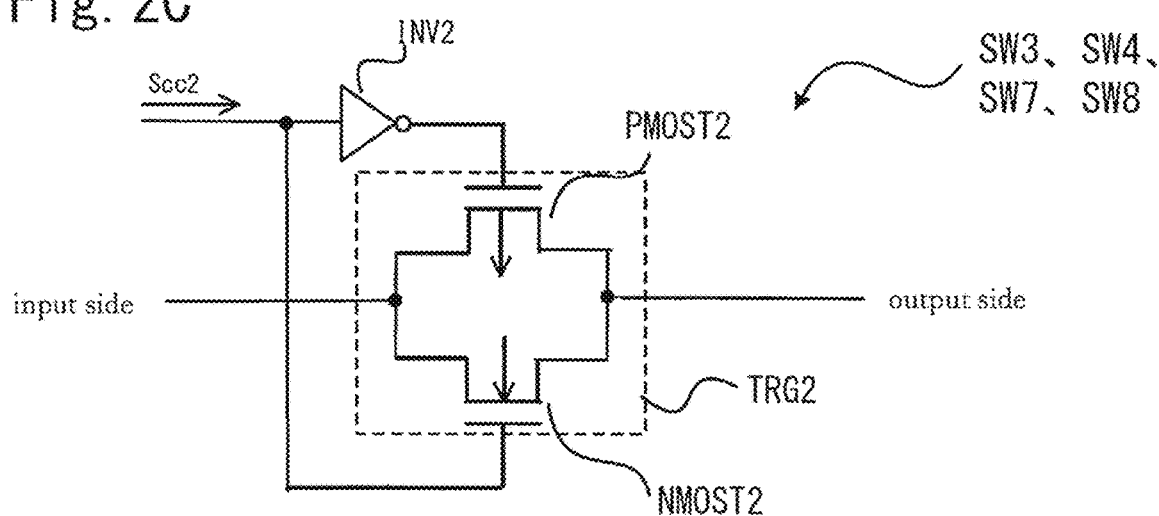
FIG. 2C is a circuit diagram of switches SW3, SW4, SW7 and SW8 according to the first embodiment.

As shown in FIG. 2C, the switch SW3 (fifth switch), the switch SW4 (sixth switch), the switch SW7 (ninth switch), and the switch SW8 (tenth switch) each includes an inverter INV2 and a transfer gate TRG2. The transfer gate TRG2 includes a P-channel MOS transistor PMOST2 and an N-channel MOS transistor NMOST2. The inverter INV2 receives the control signal Scc2 being an inverse signal of the control signal Scc1 (an inverse signal of the first control signal) and inverts the control signal Scc2 (an inverse signal of the first control signal). A first terminal (source) and a second terminal (drain) of the P-channel MOS transistor PMOST2 are connected to an input side and an output side, respectively. A signal output from the inverter INV2 is input into a control terminal (gate) of the P-channel MOS transistor PMOST1. A first terminal (drain) and a second terminal (source) of the N-channel MOS transistor NMOST2 are connected to the input side and the output side, respectively. The control signal Scc2 (an inverse signal of the first control signal) is input into a control terminal (gate) of the N-channel MOS transistor NMOST2. The transfer gate TRG2 connects the input side and the output side when the control signal Scc2 being an inverse signal of the control signal Scc1 (an inverse signal of the first control signal) is at a high level and the signal output from the inverter INV2 is at a low level, and disconnects the input side and the output side when the control signal Scc2 being an inverse signal of the control signal Scc1 (an inverse signal of the first control signal) is at a low level and the signal output from the inverter INV2 is at a high level.

Figure 3:
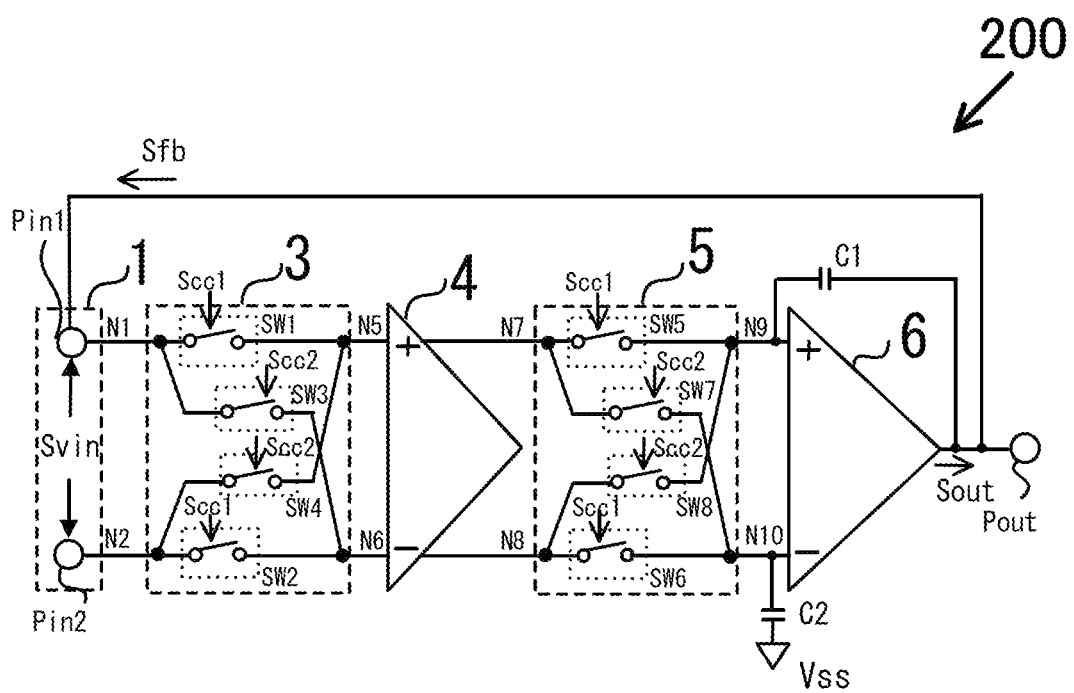
FIG. 3 is a circuit diagram showing a chopper stabilized amplifier in a comparative example.
Figure 5:
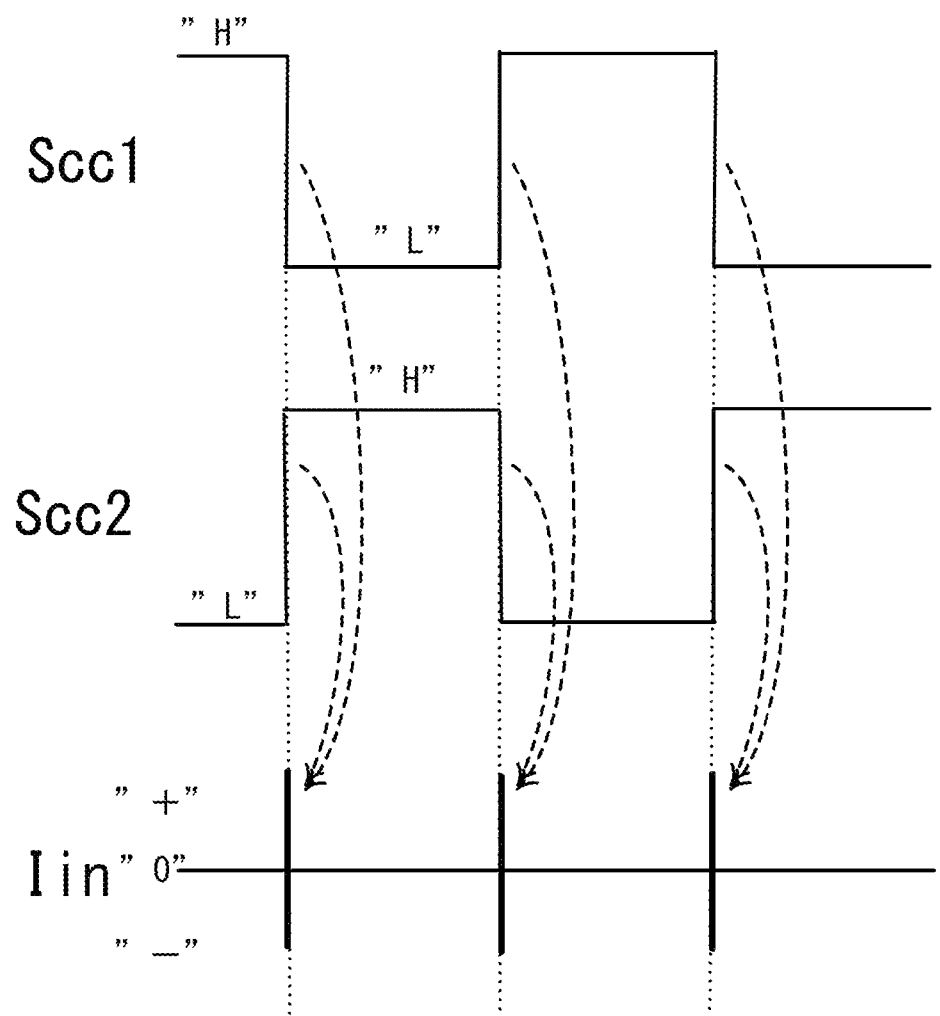
FIG. 5 is a timing chart showing operation of the chopper stabilized amplifier in the comparative example.

A chopper stabilized amplifier in a comparative example will be described with reference to FIGS. 3, 4A, 4B, 4C, and 5. FIG. 3 is a circuit diagram showing the chopper stabilized amplifier in the comparative example. FIG. 4A is a diagram describing operation of a chopper in the comparative example when the control signal Scc1 is in the enabled state and the control signal Scc2 is in the disabled state. FIG. 4B is a diagram describing operation of the chopper in the comparative example when the control signal Scc1 is the disabled state and the control signal Scc2 is in the enabled state. FIG. 4C is a diagram describing operation of the chopper in the comparative example when the control signals Scc1, Scc2 are in "transition regions". FIG. 5 is a timing chart showing operation of the chopper stabilized amplifier in the comparative example. The timing chart of FIG. 5 is obtained through a calculation using a simulation.

As shown in FIG. 3, a chopper stabilized amplifier 200 in the comparative example includes an input unit 1, a chopper 3, a chopper 5, an amplifier 4, an amplifier 6, a capacitor C1, a capacitor C2, and an output terminal Pout. The chopper stabilized amplifier 200 in the comparative example is not provided with the switch circuit 2 provided in the chopper stabilized amplifier 100 in the embodiment. The other circuit components in the chopper stabilized amplifier 200 in the comparative example except for the switch circuit 2 are the same as those in the chopper stabilized amplifier 100 in the embodiment.

Operation of the chopper 3 (first chopper) of the chopper stabilized amplifier 200 in the comparative example serving as an input chopper will be described with reference to FIGS. 4A, 4B, and 4C.

As shown in FIG. 4A, with the control signal Scc1 in the enabled state, the switch SW1 (third switch) connects the nodes N1 and N5 and the switch SW2 (fourth switch) connects the nodes N2 and N6.

As shown in FIG. 4B, with the control signal Scc2 being an inverse signal of the control signal Scc1 in the enabled state, the switch SW3 (fifth switch) connects the nodes N1 and N6, and the switch SW4 (sixth switch) connects the nodes N2 and N5.

As shown in FIG. 4C, input currents Iin(s) are generated in the chopper 3 when the control signal Scc1 and the control signal Scc2 being an inverse signal of the control signal Scc1 are in transitioning states (regions between the high and low levels), specifically, when the switches SW1 and SW2 and the switches SW3 and SW4 are turned to the respective opposite states. The input currents Iin(s) are generated between the switch SW1 (third switch) and the node N5, between the switch SW2 (fourth switch) and the node N6, between the switch SW3 (fifth switch) and the node N6, and between the switch SW4 (sixth switch) and the node N5, respectively. The input currents Iin(s) are usually such that the current flowing on the amplifier 4 (first amplifier) side (designated herein as "plus") are larger than the currents flowing on the input unit side (designated herein as "minus"). In a case where the input currents Iin(s) generated are large, the voltage at input side of the amplifier 4 drops due to the resistance components of the input lines. This lowers the voltage accuracy of the chopper stabilized amplifier.

As shown in FIG. 5, in the chopper stabilized amplifier 200 in the comparative example, input currents Iin(s) with high current levels are generated in a first transition period and in a second transition period. In the first transition period, the control signal Scc1 transitions from the enabled state (high level "H") to the disabled state (low level "L") and the control signal Scc2 being an inverse signal of the control signal Scc1 transitions from the disabled state (low level "L") to the enabled state (high level "H"). In the second transition period, the control signal Scc1 transitions from the disabled state (low level "L") to the enabled state (high level "H") and the control signal Scc2 being an inverse signal of the control signal Scc1 transitions from the enabled state (high level "H") to the disabled state (low level "L"). The input current Iin on the plus side is 140 µA, and the input current Iin on the minus side is 80 µA, for example.

Figure 6:
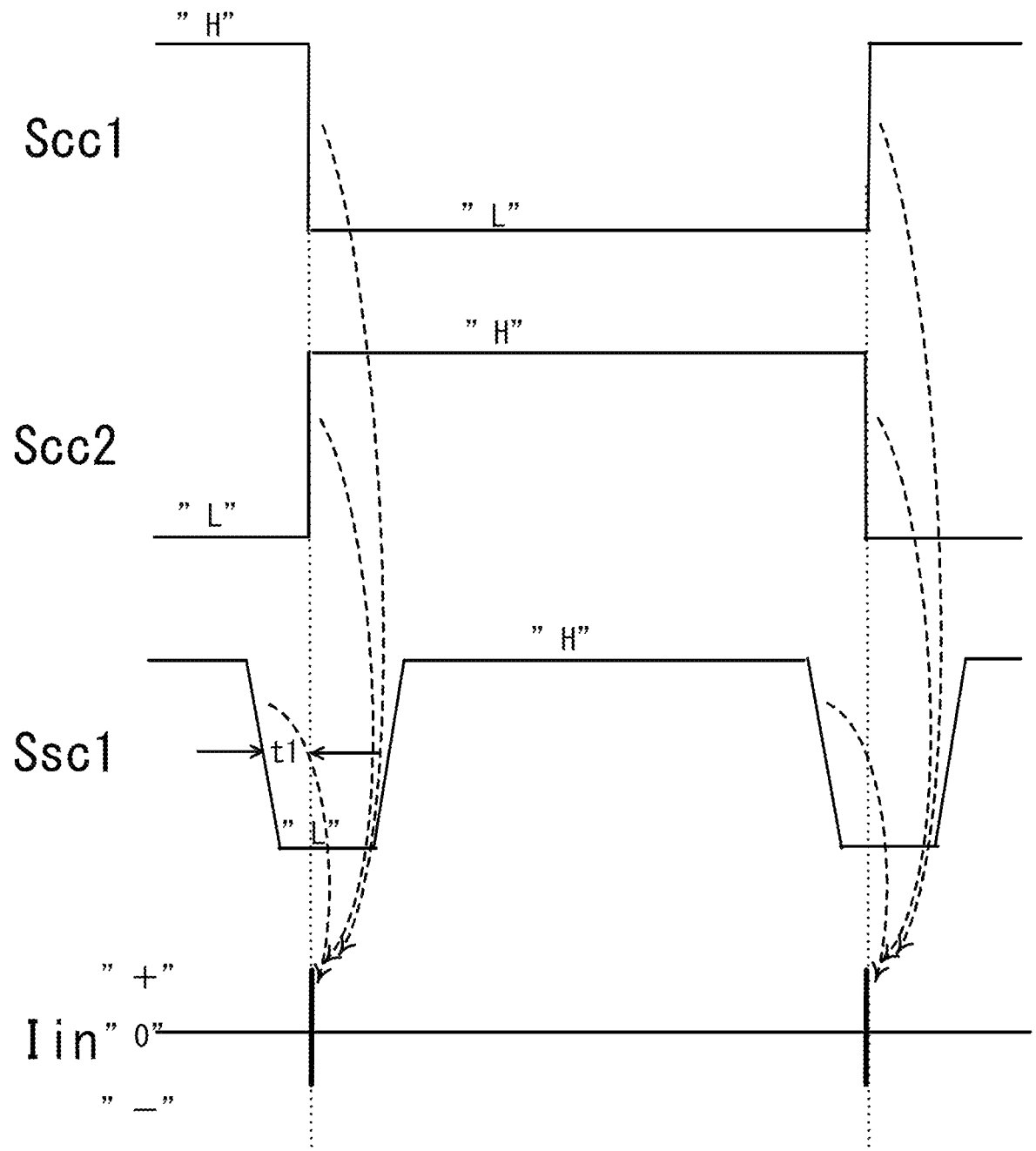
FIG. 6 is a timing chart showing operation of the chopper stabilized amplifier according to the first embodiment when a time difference t1 is set between an intermediate potential of a control signal Ssc1 at an off timing and intermediate potentials of the control signals Scc1, Scc2.
Figure 7:
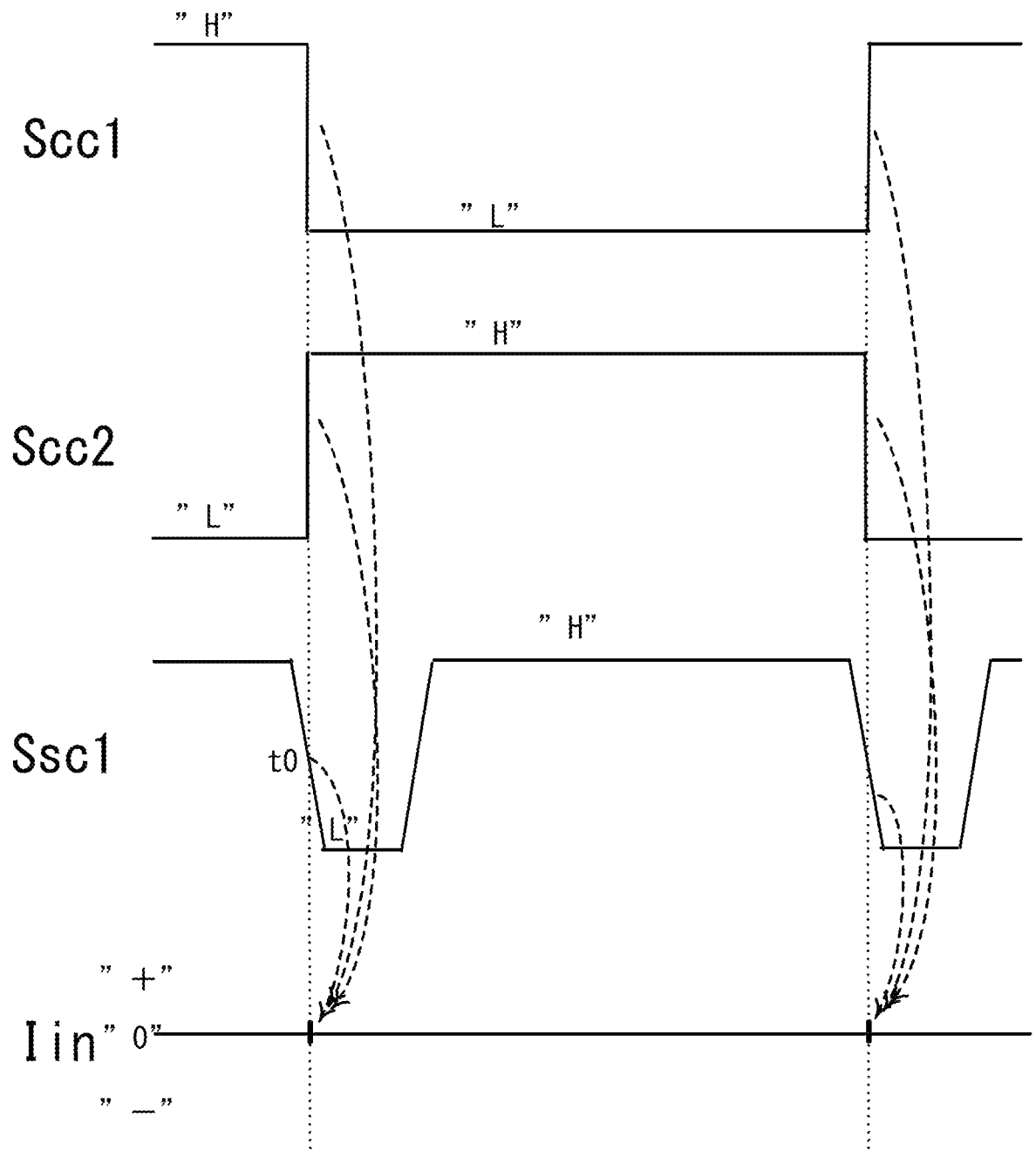
FIG. 7 is a timing chart showing operation of the chopper stabilized amplifier according to the first embodiment when the intermediate potential of the control signal Ssc1 at an off timing and the intermediate potentials of the control signals Scc1, Scc2 are set to be reached at the same time (to, the time difference is zero)
Figure 8:
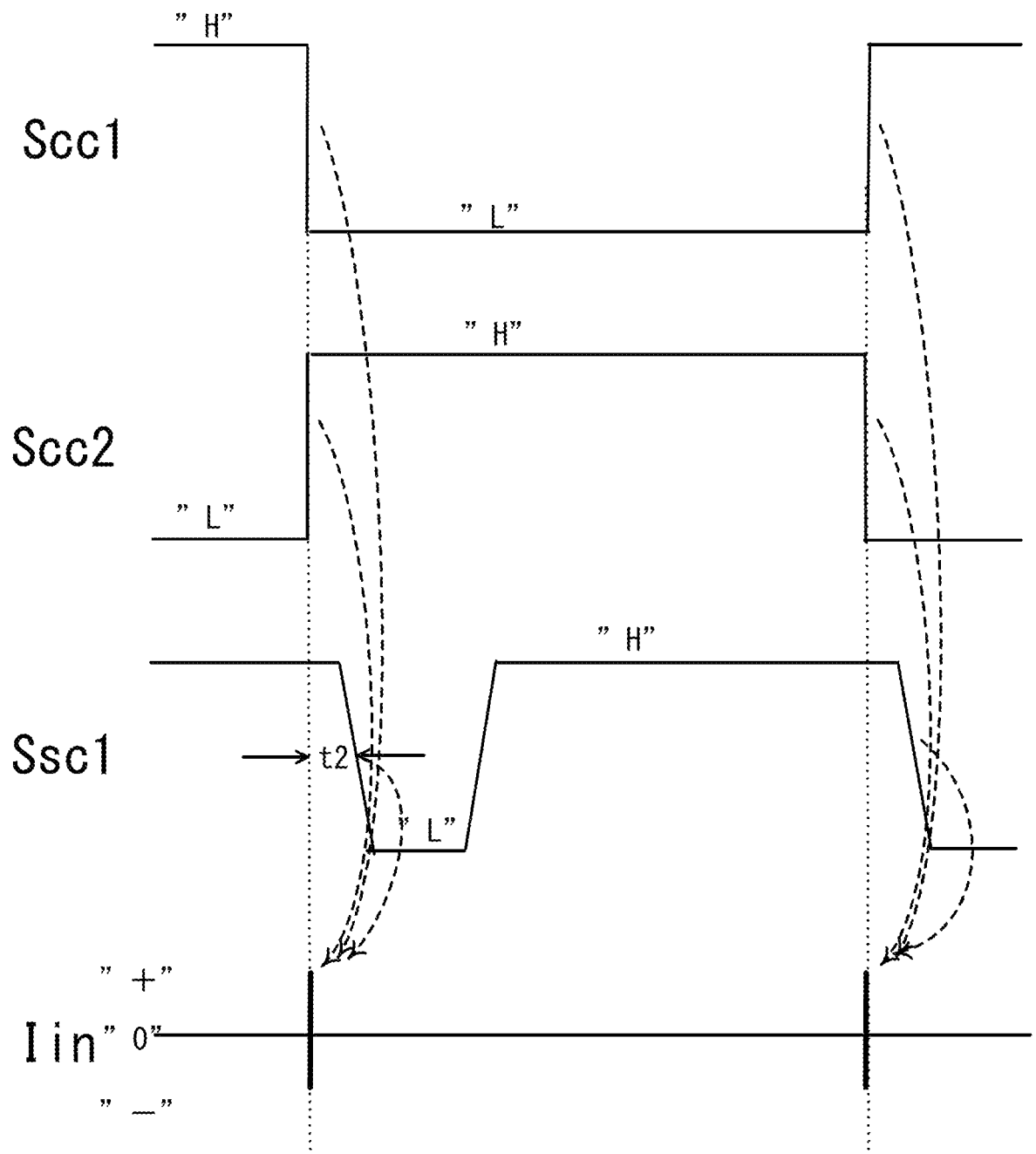
FIG. 8 is a timing chart showing operation of the chopper stabilized amplifier according to the first embodiment when a time difference t2 is set between the intermediate potentials of the control signals Scc1, Scc2 and the intermediate potential of the control signal Ssc1 at an off timing.

Next, operation of the chopper stabilized amplifier 100 in the embodiment will be described with reference to FIGS. 6 to 8. FIG. 6 is a timing chart showing operation of the chopper stabilized amplifier in a case where a time difference t1 is set between an intermediate potential of the control signal Ssc1 at an off timing and intermediate potentials of the control signals Scc1 and Scc2. FIG. 7 is a timing chart showing operation of the chopper stabilized amplifier in a case where the intermediate potential of the control signal Ssc1 at an off timing and the intermediate potentials of the control signals Scc1 and Scc2 are set to be reached at the same time (t0, the time difference is zero). FIG. 8 is a timing chart showing operation of the chopper stabilized amplifier in a case where a time difference t2 is set between the intermediate potentials of the control signals Scc1 and Scc2 and the intermediate potential of the control signal Ssc1 at an off timing. The timing charts of FIGS. 6 to 8 are obtained through calculations using simulations.

As shown in FIG. 6, the input current Iin on the plus side is 80 µA and the input current Iin on the minus side is 50 µA at the time taken by the control signal Ssc1 (second control signal) changing from the enabled state (high level "H") to the disabled state (low level "L"). The time difference t1 is set between a time at the intermediate potential of the control signal Ssc1 (second control signal) at the off timing and a time at the intermediate potentials of the control signal Scc1 (first control signal) and the control signal Scc2 (an inverse signal of the first control signal), so that the transition region for the control signal Ssc1 (second control signal) at the off timing and the transition regions for the control signal Scc1 (first control signal) and the control signal Scc2 (an inverse signal of the first control signal) are arranged adjacently to each other.

Here, the time length of the transition region for the control signal Ssc1 (second control signal) at the time taken both the switch SWa and the switch SWb changing from on-state to off-state set to be longer than the time length of the transition regions for the control signal Scc1 (first control signal) and the control signal Scc2 (an inverse signal of the first control signal).

As shown in FIG. 7, the input current Iin on the plus side is 5 µA and the input current Iin on the minus side is 3 µA at the time taken by the control signal Ssc1 (second control signal) changing from the enabled state (high level "H") to the disabled state (low level "L"). The time at the intermediate potential of the control signal Ssc1 (second control signal) at the off timing and the time at the intermediate potentials of the control signal Scc1 (first control signal) and the control signal Scc2 (an inverse signal of the first control signal) are set to coincide with each other (the time difference is zero, t0).

As shown in FIG. 8, the input current Iin on the plus side is 60 µA and the input current Iin on the minus side is 40 µA at the time taken by the control signal Ssc1 (second control signal) changing from the enabled state (high level "H") to the disabled state (low level "L"). The time difference t2 is set between a time at the intermediate potentials of the control signal Scc1 (first control signal) and the control signal Scc2 (an inverse signal of the first control signal) and a time at the intermediate potential of the control signal Ssc1 (second control signal) at the off timing, so that the transition regions for the control signal Scc1 (first control signal) and the control signal Scc2 (an inverse signal of the first control signal) and the transition region for the control signal Ssc1 (second control signal) at the off timing are arranged adjacently to each other.

Figure 9:
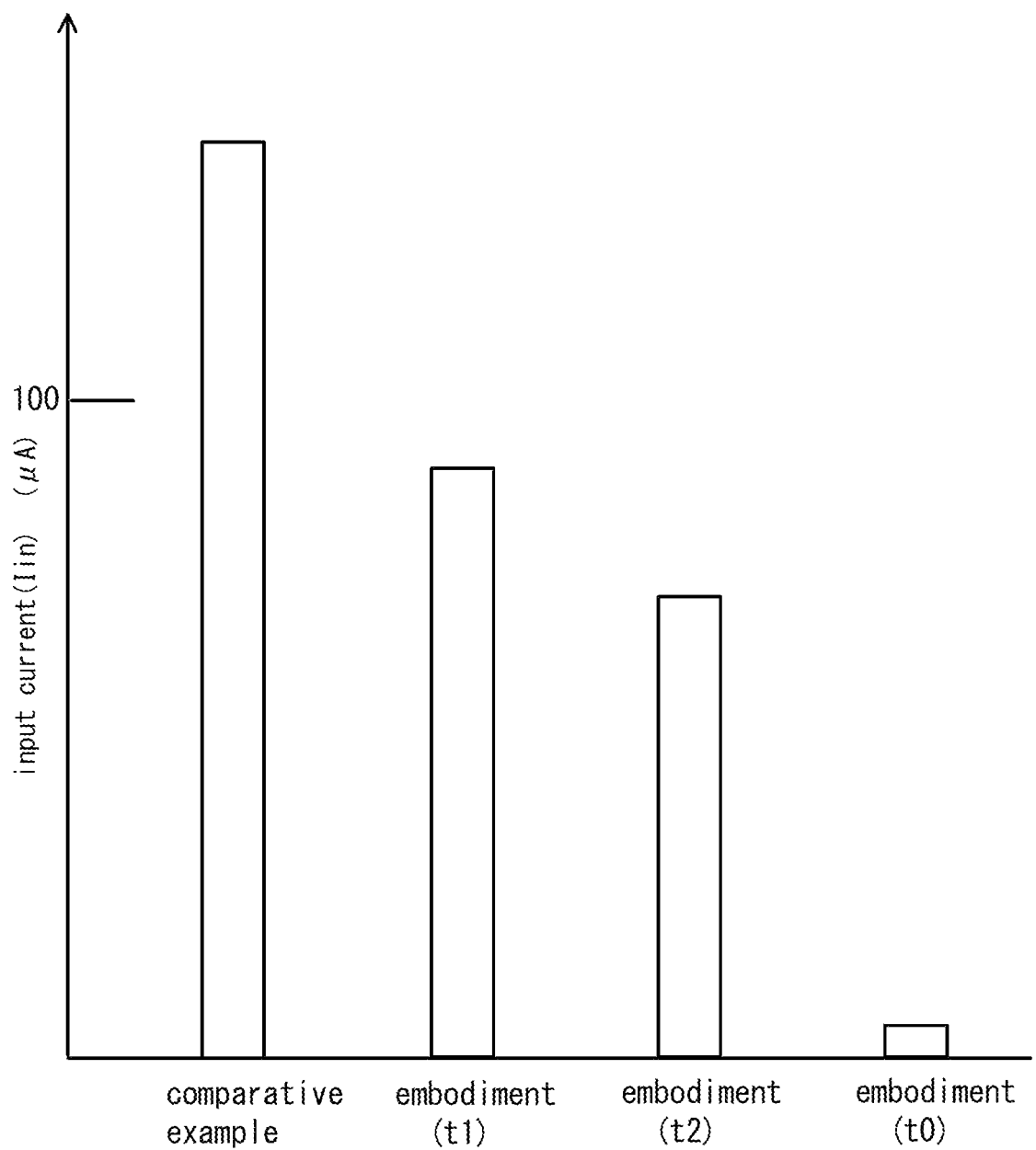
FIG. 9 is a diagram comparing input current characteristics.

Next, input currents generated in the chopper stabilized amplifier 100 in the embodiment and the chopper stabilized amplifier 200 in the comparative example will be described with reference to FIG. 9. FIG. 9 is a diagram comparing input current characteristics.

As shown in FIG. 9, the input currents Iin(s) generated in the chopper stabilized amplifier 100 in the embodiment can be reduced to be significantly smaller than the input currents Iin(s) generated in the chopper stabilized amplifier 200 in the comparative example. Incidentally, as the values of the input currents Iin(s) shown in FIG. 9, values on the "+" side are used.

More specifically, the input currents Iin(s) generated in the chopper stabilized amplifier 100 in the embodiment can be reduced to be smaller than the input currents In(s) generated in the chopper stabilized amplifier 200 in the comparative example in the case where the transition region for the control signal Ssc1 (second control signal) at an off timing and the transition regions for the control signal Scc1 (first control signal) and the control signal Scc2 (an inverse signal of the first control signal) are arranged adjacently to each other (the time difference t1) or in the case where the transition regions for the control signal Scc1 (first control signal) and the control signal Scc2 (an inverse signal of the first control signal) and the transition region for the control signal Ssc1 (second control signal) at an off timing are arranged adjacently to each other (time difference t2).

The input currents Iin(s) generated in the chopper stabilized amplifier 100 in the embodiment can be reduced to be significantly smaller than the input currents In(s) generated in the chopper stabilized amplifier 200 in the comparative example (specifically, reduced by ⅛) in the case where the intermediate potential of the control signal Ssc1 (second control signal) at an off timing and the intermediate potentials of the control signal Scc1 (first control signal) and the control signal Scc2 (an inverse signal of the first control signal) are set to coincide with each other ((time difference is zero, t0).

A first reason why the above can reduce the input currents In(s) is that the input currents Iin(s) flow through the source-drain capacitances of the N-channel MOS transistors NMOST1 and the P-channel MOS transistors PMOST1 forming the switch SWa (first switch) and the switch SWb (second switch).

A second reason is that the on-resistances of the N-channel MOS transistors NMOST1 and the P-channel MOS transistors PMOST1 forming the switch SWa (first switch) and the switch SWb (second switch), which are about several tens of Ω during on state, are about several KM when the control signal Ssc1 (second control signal) is set in the changing region in an on-state to off-state or off-state to on-state, e.g., at the intermediate potential. This is because the on-resistances on the enabled or disabled state are lower than the on-resistances at the intermediate potential.

A third reason is that the gate-source capacitances or drain-gate capacitances of the N-channel MOS transistors NMOST1 and the P-channel MOS transistors PMOST1 are larger when the time difference is t0 (the time difference is zero) than when the time difference is t1 or t2.

As mentioned above, the chopper stabilized amplifier in the embodiment includes the input unit 1, the switch circuit 2, the choppers 3, 5, the amplifiers 4, 6, the capacitors C1, C2, and the output terminal Pout. The switch circuit 2 is provided between the input unit 1 and the chopper 3, and includes the switches SWa and SWb, to which the control signal Ssc1 is input. The chopper 3 is provided between the switch circuit 2 and the amplifier 4, and includes the switches SW1 and SW2, to which the control signal Scc1 is input, and the switches SW3 and SW4, to which the control signal Scc2 being an inverse signal of the control signal Scc1 (an inverse signal of the first control signal) is input. The intermediate potential of the control signal Sac is set to coincide with the intermediate potentials of the control signals Scc1, Scc2, or the transition region for the control signal Ssc1 is set to be adjacent to the transition regions for the control signals Scc1, Scc2. In this way, the input currents generated when the chopper 3 performs a modulating operation is reduced.

Thus, input currents generated when the input chopper performs a modulating operation can be significantly reduced. It is therefore possible to provide a high-accuracy chopper amplifier.

Note that the values of the input currents In(s) shown in FIGS. 6 to 9 are mere examples calculated using simulations. The values of the input currents Iin(s) are not necessarily limited to these values.

Figure 10:
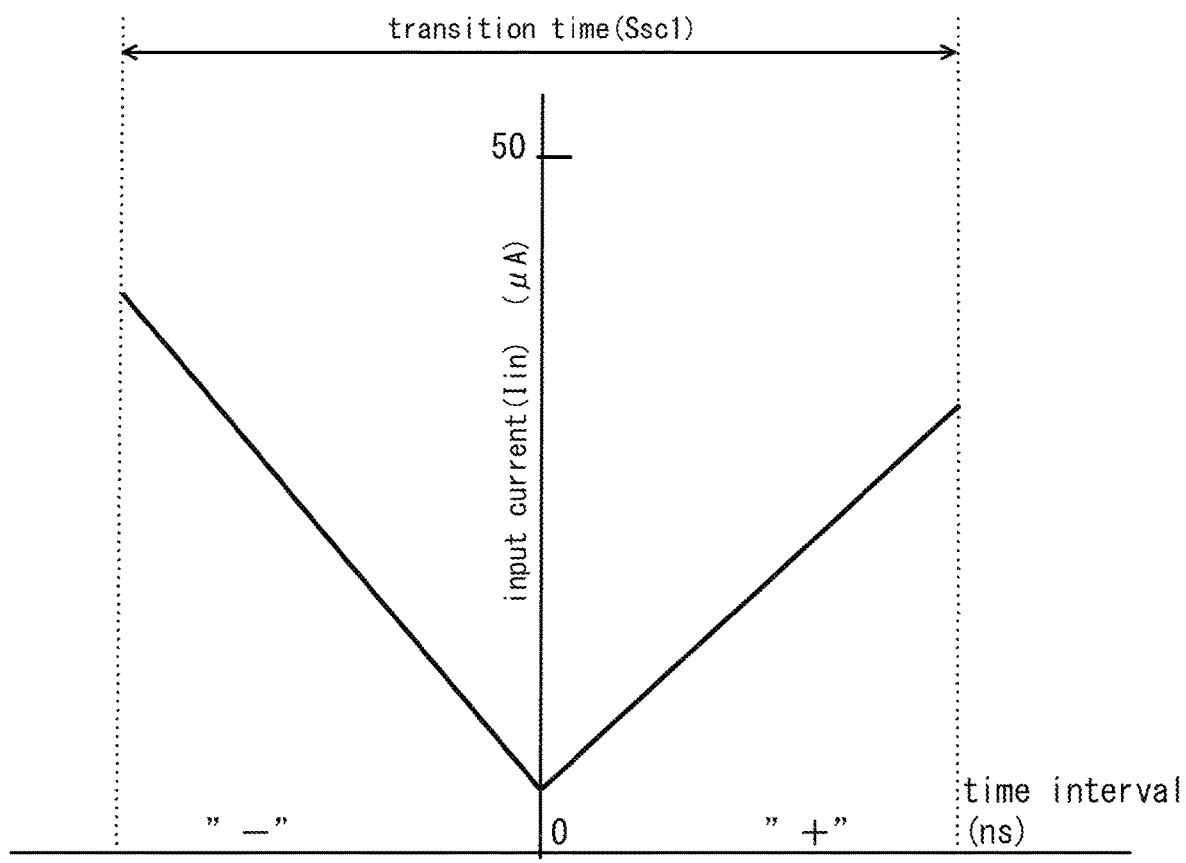
FIG. 10 is a diagram showing a relationship between an input current and the time difference between an intermediate potential of a control signal Ssc1 at an off timing and intermediate potentials of control signals Scc1, Scc2 according to a second embodiment.

A chopper stabilized amplifier according to a second embodiment will be described with reference to a drawing. FIG. 10 is a diagram showing a relationship between an input current and the time difference between an intermediate potential of a control signal Ssc1 at an off timing and intermediate potentials of control signals Scc1, Scc2 in the chopper stabilized amplifier. FIG. 10 is a diagram obtained through a calculation using a simulation, and data on an input current Iin on the "+" side is used.

In the second embodiment, at an off timing of the control signals, the time difference between the intermediate potential of the control signal Ssc1 and the intermediate potentials of the control signals Scc1, Scc2 is shifted to a predetermined time, input currents corresponding to time differences at each time are investigated.

As shown in FIG. 10, as the time difference between the intermediate potential of the control signal Ssc1 at an off timing and the intermediate potentials of the control signals Scc1, Scc2 is shifted to predetermined time intervals to the end of a transition region (see the region in FIG. 10 where "+" is shown), the input current Iin, which is smallest when the time difference is zero, increases with in the time difference.

As the time difference between the intermediate potentials of the control signals Scc1, Scc2 and the intermediate potential of the control signal Ssc1 at an off timing is shifted to predetermined time intervals to the end of a transition region (see the region in FIG. 10 where "−" is shown), the input current Iin, which is smallest when the time difference is zero, decreases with in the time difference.

In a case where the intermediate potential of the control signal Ssc1 and the intermediate potentials of the control signals Scc1, Scc2 are caused to coincide with each other in time (the time difference is zero), the input current Iin is significantly reduced and becomes the smallest value.

As described above, in the chopper stabilized amplifier in the embodiment, at off timing for the control signal Ssc1 to control switches SWa and SWb, the intermediate potential of the control signal Ssc1 and the intermediate potentials of the control signal Scc1 to control switches SW1 and SW2 and the control signal Scc2 to control switches SW3 and SW4, which is an inverse signal of the control signal Scc1, are configured to coincide with each other in time.

Thus, input currents generated when the input chopper performs a modulating operation can be significantly reduced. It is therefore possible to provide a high-accuracy chopper amplifier.

Figure 11:
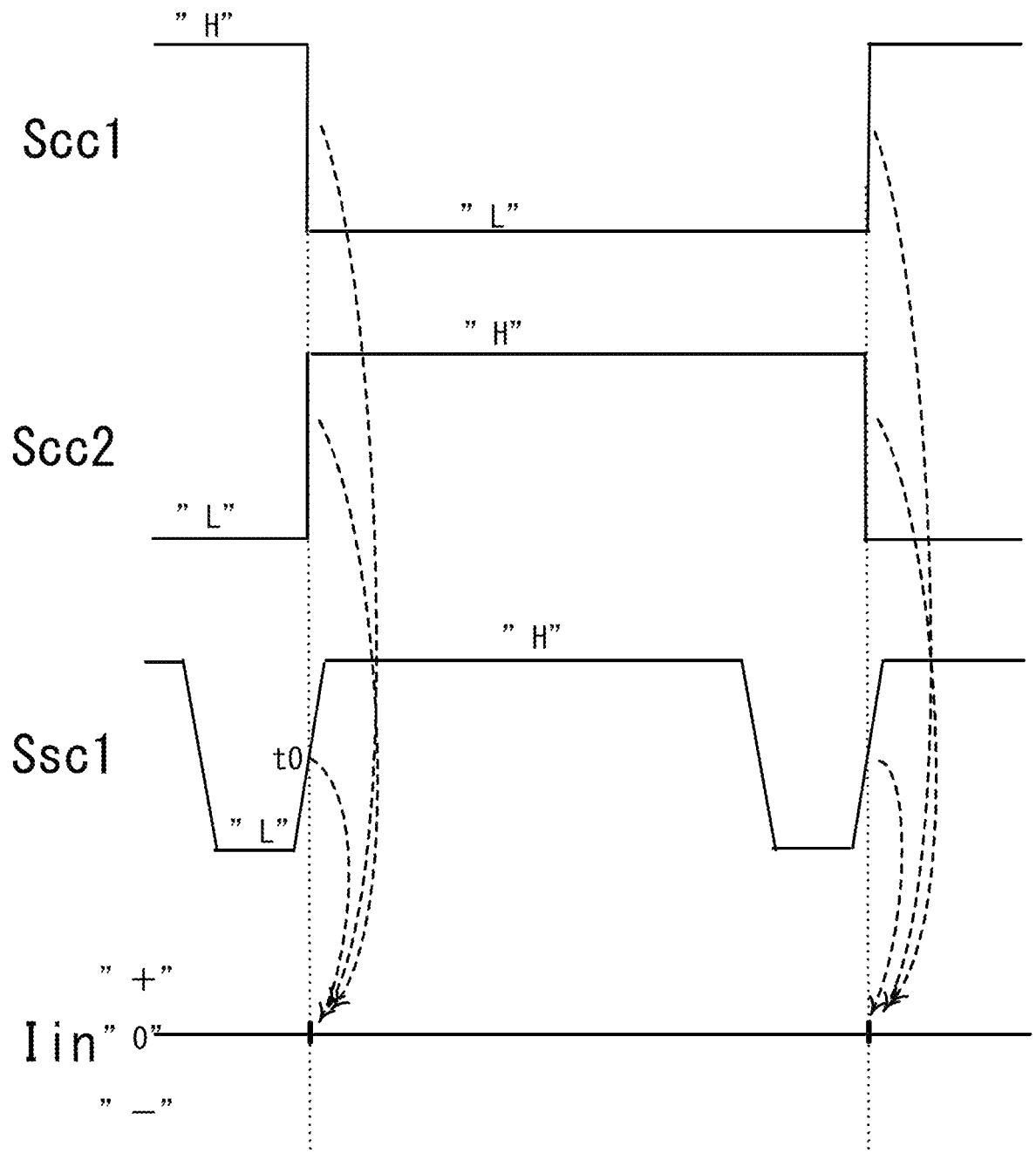
FIG. 11 is a timing chart showing operation of a chopper stabilized amplifier according to a third embodiment when an intermediate potential of a control signal Ssc1 at an on timing and intermediate potentials of control signals Scc1, Scc2 are set to be reached at the same time (t0, the time difference is zero)

A chopper stabilized amplifier according to a third embodiment will be described with reference to drawings. FIG. 11 is a timing chart showing operation of the chopper stabilized amplifier in a case where an intermediate potential of a control signal Ssc1 at an on timing and intermediate potentials of control signals Scc1, Scc2 are set to be reached at the same time (t0, the time difference is zero).

In the third embodiment, input currents corresponding to time differences between the intermediate potential of the control signal Ssc1 at an on timing for the control signal Ssc1 and the intermediate potentials of the control signals Scc1, Scc2 are examined.

As shown in FIG. 11, an input current Iin on the plus side is 5 µA and an input current Iin on the minus side is 3 µA in a case where, after the start of transition of the control signal Ssc1 (second control signal) from a disabled state (low level "L") to a enabled state (high level "H"), the intermediate potential of the control signal Ssc1 (second control signal) at the on timing and the intermediate potentials of the control signal Scc1 (first control signal) and the control signal Scc2 (an inverse signal of the first control signal) are set to coincide with each other in time (the time difference is zero, t0).

Figure 12:
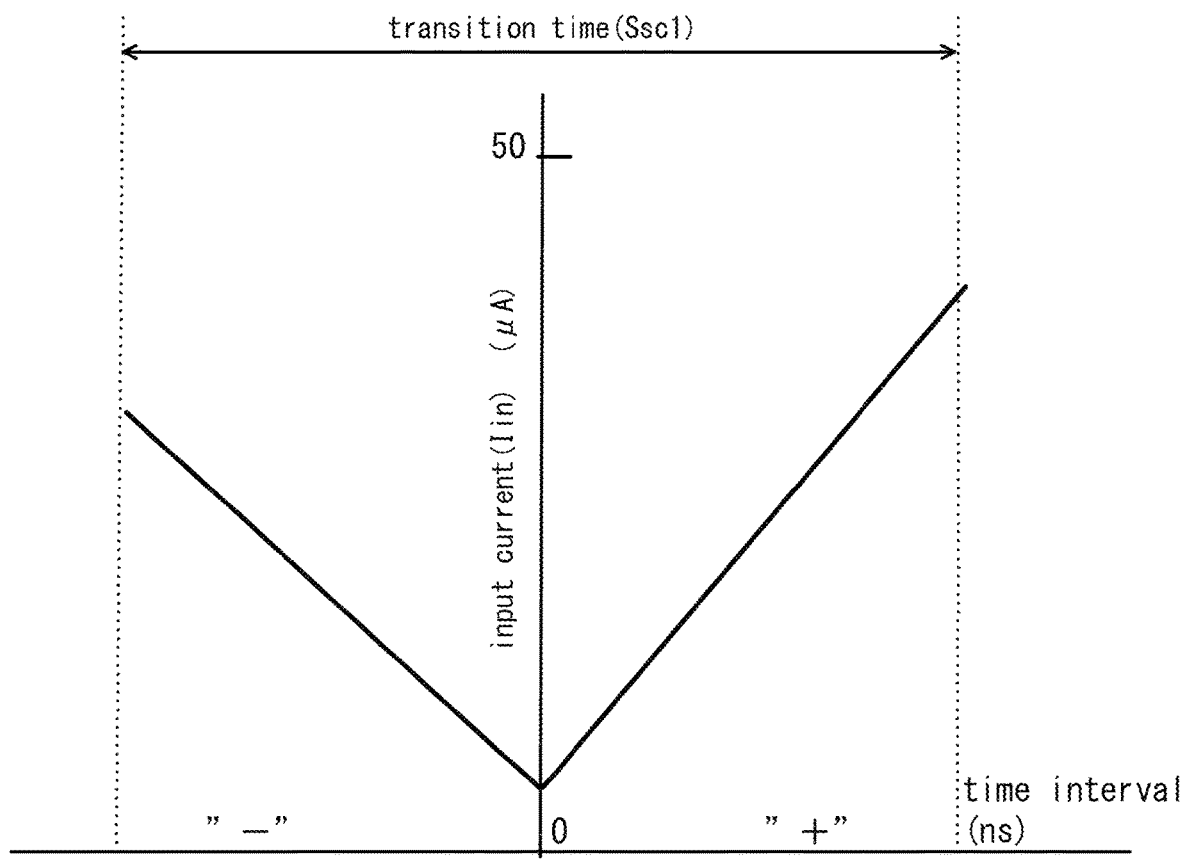
FIG. 12 is a diagram showing a relationship between an input current and the time difference between the intermediate potential of the control signal Ssc1 at an on timing and the intermediate potentials of the control signals Scc1, Scc2 according to the third embodiment.

Next, a relationship between the input current and the time difference between the intermediate potential of the control signal Ssc1 at an on timing for the control signal Ssc1 and the intermediate potentials of the control signals Scc1, Scc2 will be described with reference to FIG. 12. FIG. 12 is a diagram showing a relationship between the input current and the time difference between the intermediate potential of the control signal Ssc1 at an on timing and the intermediate potentials of the control signals Scc1, Scc2.

As shown in FIG. 12, as the time difference between the intermediate potential of the control signal Ssc1 at an on timing and the intermediate potentials of the control signals Scc1, Scc2 is shifted at predetermined time intervals to the end of a transition region (see the region in FIG. 12 where "+" is shown), the input current Iin, which is smallest when the time difference is zero, increases with increase in the time difference.

As the time difference between the intermediate potentials of the control signals Scc1, Scc2 and the intermediate potential of the control signal Ssc1 at an on timing is shifted at predetermined time intervals to the end of a transition region (see the region in FIG. 12 where "−" is shown), the input current Iin, which is smallest when the time difference is zero, increases with increase in the time difference.

In a case where the intermediate potential of the control signal Ssc1 at an on timing and the intermediate potentials of the control signals Scc1, Scc2 are caused to coincide with each other in time (the time difference is zero), the input current Iin is significantly reduced and takes the smallest value.

Note that FIGS. 11 and 12 are obtained through calculations using a simulation. As the input current Iin in FIG. 12, values on the "+" side are used.

As described above, in the chopper stabilized amplifier in the embodiment, at an on timing for the control signal Ssc1 to control switches SWa and SWb, the intermediate potential of the control signal Ssc1 and the intermediate potentials of the control signal Scc1 to control switches SW1 and SW2 and the control signal Scc2 to control switches SW3 and SW4, which is an inverse signal of the control signal Scc1, are configured to coincide with each other in time.

Thus, input currents generated when the input chopper performs a modulating operation can be significantly reduced. It is therefore possible to provide a high-accuracy chopper amplifier.

Figure 13:
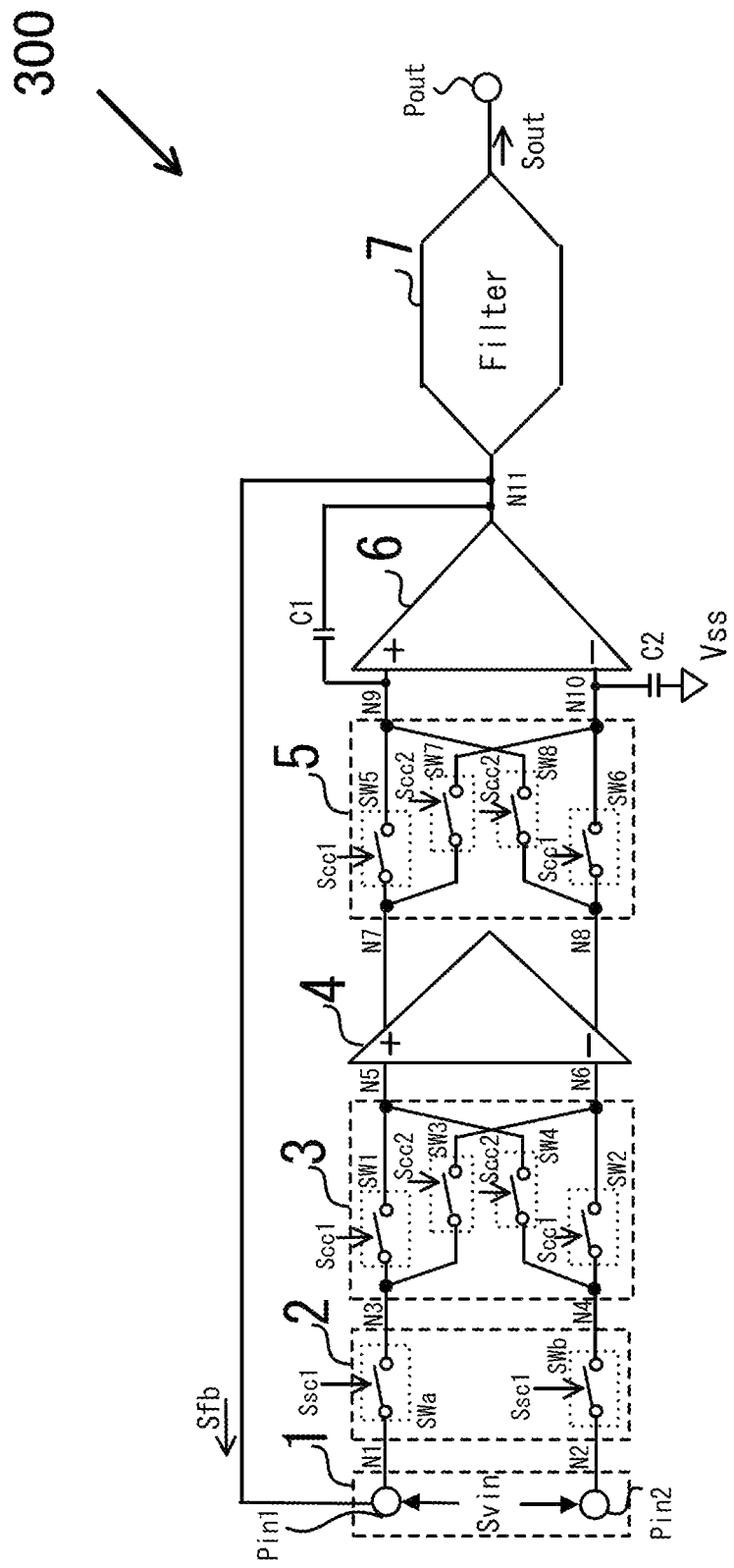
FIG. 13 is a circuit diagram showing a chopper stabilized amplifier according to a fourth embodiment.

A chopper stabilized amplifier according to a fourth embodiment will be described with reference to a drawing. FIG. 13 is a circuit diagram showing the chopper stabilized amplifier.

In the fourth embodiment, a filter is provided between a second amplifier and an output terminal to reduce noise.

In the following, identical component portions to those in the first embodiment are designated by identical reference signs, and description of the portions is omitted. Only different portions will be described.

As shown in FIG. 13, a chopper stabilized amplifier 300 includes an input unit 1, a switch circuit 2, a chopper 3, a chopper 5, an amplifier 4, an amplifier 6, a filter 7, a capacitor C1, a capacitor C2, and an output terminal Pout. The chopper stabilized amplifier 300 is used in a battery-driven device, a portable device, a medical device, a wearable device, Internet-of-Things (IoT), a medical sensor, a fitness tracker, or the like.

The filter 7 is provided between the amplifier 6 (second amplifier) and the output terminal Pout. The filter 7 receives an amplified signal output from the amplifier 6 (second amplifier) (a signal from a node N11), removes a noise component in the signal, and outputs the noise-removed signal through the output terminal Pout. It is preferable to use a low pass filter (LPF), a band reject filter, a notch filter, or the like as the filter 7.

As mentioned above, the chopper stabilized amplifier in the embodiment includes the input unit 1, the switch circuit 2, the choppers 3, 5, the amplifiers 4, 6, the filter 7, the capacitors C1, C2, and the output terminal Pout. The filter 7 is provided between the amplifier 6 and the output terminal Pout, receives an amplified signal output from the amplifier 6, and removes a noise component in the signal.

Thus, input currents generated when the input chopper performs a modulating operation can be significantly reduced, and noise generated can be reduced. It is therefore possible to provide a high-accuracy chopper amplifier.

While certain embodiments have been described, these embodiments have been presented by way of example only, and are not intend to limit the scope of the inventions. Indeed, the novel embodiments described herein may be embodied in a variety of the other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A chopper stabilized amplifier comprising:
   an input unit configured to receive a differential input signal at a first input terminal and a second input terminal;
   a first chopper configured to modulate the differential input signal based on a first control complementary signals of the first control signal;
   a first amplifier configured to amplify signals with a modulated differential output from the first chopper; and
   a switch circuit provided between the input unit and the first chopper to receive a second control signal, configured to control an input current which flows in the first chopper and reduce the input current which flows in the first chopper when the first chopper performs a modulating operation, by using an operation with the second control signal, wherein a transition time of the second control signal, whose state changes from on to off or from off to on, is set to overlap the transition time of the first control signal and a complementary signal of the first control signal.

2. The chopper stabilized amplifier according to claim 1, wherein the switch circuit includes
   a first switch with an input side connected to the first input terminal to be electrically conductive the first input terminal and the first chopper when the second control signal is in an enabled state, and disconnect the first input terminal and the first chopper when the second control signal is in a disabled state, and
   a second switch with an input side connected to the second input terminal to connect the second input terminal and the first chopper when the second control signal is in the enabled state, and to be electrically non-conductive the second input terminal and the first chopper when the second control signal is in the disabled state.

3. The chopper stabilized amplifier according to claim 1, wherein a time length of the transition time for the second control signal is longer than time lengths of the transition times for the first control signal and a complementary signal of the first control signal.

4. The chopper stabilized amplifier according to claim 2, wherein an intermediate potential of the second control signal in a transition time for the second control signal in which the second control signal shifts from the enabled state to the disabled state or from the disabled state to the enabled state is set to overlap transition regions for the first control signal and a complementary signal of the first control signal.

5. The chopper stabilized amplifier according to claim 3, wherein
the first switch includes a first transfer gate with a first P-channel MOS transistor and a first N-channel MOS transistor, or includes MOS transistors with multistage structure,
the second switch includes a second transfer gate with a second P-channel MOS transistor and a second N-channel MOS transistor, and
on-resistances of the first P-channel MOS transistor, the second P-channel MOS transistor, the first N-channel MOS transistor, and the second N-channel MOS transistor are higher when the second control signal is set at an intermediate potential in the transitioning state than when the second control signal is in the enabled state.

6. The chopper stabilized amplifier according to claim 5, wherein the on resistances of the first P-channel MOS transistor, the second P-channel MOS transistor, the first N-channel MOS transistor, and the second N-channel MOS transistor, or MOS transistors with multistage structure, are higher when the second control signal is set at the intermediate potential in the transitioning state than when the second control signal is set on the enabled state side relative to the intermediate potential.

7. The chopper stabilized amplifier according to claim 2, wherein the first chopper includes
a third switch with an input side connected to an output side of the first switch to connect the output side of the first switch and a plus input port of the first amplifier when the first control signal is in an enabled state, and disconnect the output side of the first switch and the plus input port of the first amplifier when the first control signal is in a disabled state,
a fourth switch with an input side connected to an output side of the second switch to connect the output side of the second switch and a minus input port of the first amplifier when the first control signal is in the enabled state, and disconnect the output side of the second switch and the minus input port of the first amplifier when the first control signal is in the disabled state,
a fifth switch with an input side connected to the output side of the first switch to connect the output side of the first switch and the minus input port of the first amplifier when the inverse signal of the first control signal is in an enabled state, and disconnect the output side of the first switch and the minus input port of the first amplifier when the inverse signal of the first control signal is in a disabled state, and
a sixth switch with an input side connected to the output side of the second switch to connect the output side of the second switch and the plus input port of the first amplifier when the inverse signal of the first control signal is in the enabled state, and disconnect the output side of the second switch and the plus input port of the first amplifier when the inverse signal of the first control signal is in the disabled state.

8. The chopper stabilized amplifier according to claim 7, wherein the first to sixth switches each includes a transfer gate including a P-channel MOS transistor and an N-channel MOS transistor.

9. The chopper stabilized amplifier according to claim 1, further comprising:
a second chopper configured to receive an amplified differential signal output from the first amplifier and modulate the amplified differential signal based on the first control signal and the inverse signal of the first control signal; and
a second amplifier configured to amplify signals with a modulated differential output from the second chopper and output an output signal through an output terminal, the output signal being fed back and input into the first input terminal.

10. The chopper stabilized amplifier according to claim 1, further comprising:
a second chopper configured to receive a first amplified differential signal output from the first amplifier and modulate the first amplified differential signal based on the first control signal and the inverse signal of the first control signal;
a second amplifier configured to amplify signals with a modulated differential output from the second chopper and output a second amplified differential signal, the second amplified differential signal being fed back and input into the first input terminal; and
a filter configured to receive the second amplified differential signal and output a noise-removed signal through an output terminal as an output signal.

11. The chopper stabilized amplifier according to claim 10, wherein the filter is one of a low pass filter (LPF), a band reject filter and a notch filter.

12. The chopper stabilized amplifier according to claim 1, wherein the chopper stabilized amplifier is used in at least one of a battery-driven device, a portable device, a medical device, a wearable device, Internet-of-Things (IoT), a medical sensor, or a fitness tracker.

* * * * *